(12) United States Patent
Cha et al.

(10) Patent No.: US 11,073,566 B2
(45) Date of Patent: Jul. 27, 2021

(54) BATTERY MANAGEMENT APPARATUS AND METHOD THEREOF

(71) Applicant: LG Chem, Ltd., Seoul (KR)

(72) Inventors: Sun-Young Cha, Daejeon (KR); Won-Tae Joe, Daejeon (KR)

(73) Assignee: LG Chem, Ltd.

( * ) Notice: Subject to any disclaimer, the term of this patent is extended or adjusted under 35 U.S.C. 154(b) by 359 days.

(21) Appl. No.: 16/308,953

(22) PCT Filed: Oct. 18, 2017

(86) PCT No.: PCT/KR2017/011551
§ 371 (c)(1),
(2) Date: Dec. 11, 2018

(87) PCT Pub. No.: WO2018/105881
PCT Pub. Date: Jun. 14, 2018

(65) Prior Publication Data
US 2019/0257890 A1      Aug. 22, 2019

(30) Foreign Application Priority Data

Dec. 5, 2016   (KR) .................. 10-2016-0164606

(51) Int. Cl.
*G01R 31/3842*   (2019.01)
*H01M 10/48*     (2006.01)
(Continued)

(52) U.S. Cl.
CPC ........ *G01R 31/3842* (2019.01); *H01M 10/42* (2013.01); *H01M 10/486* (2013.01);
(Continued)

(58) Field of Classification Search
CPC ........... G01R 31/3842; G01R 31/3648; H01M 10/486; H01M 10/42; H01M 2010/4271;
(Continued)

(56) References Cited

U.S. PATENT DOCUMENTS

2008/0183408 A1   7/2008   Matsuura et al.
2011/0210859 A1   9/2011   Kim
(Continued)

FOREIGN PATENT DOCUMENTS

CN   102122733 A   7/2011
CN   102754272 A   10/2012
(Continued)

OTHER PUBLICATIONS

Cordoba-Arenas et al., Capacity and Power Fade Cycle-Life Model for Plug-in Hybrid Electric Vehicle Lithium-Ion Battery Cells Containing Blended Spinel and Layered-Oxide Positive Electrodes, Online Dec. 15, 2014, Journal of Power Sources 278, pp. 473-483 (Year: 2014).*

(Continued)

*Primary Examiner* — Toan M Le
(74) *Attorney, Agent, or Firm* — Lerner, David, Littenberg, Krumholz & Mentlik, LLP

(57) ABSTRACT

Disclosed is a battery management apparatus and method. The battery management apparatus according to an embodiment of the present disclosure may be configured to, when the voltage of a battery being discharged is equal to or lower than a preset discharge threshold voltage, predict the time left for a lower limit of discharge voltage preset lower than the discharge threshold voltage from the current time, and maintain or adjust the output parameter of the battery based on the predicted remaining time.

18 Claims, 8 Drawing Sheets

(51) Int. Cl.
*H02J 7/00* (2006.01)
*H01M 10/42* (2006.01)

(52) U.S. Cl.
CPC .............. *H02J 7/00* (2013.01); *H02J 7/0021* (2013.01); *H02J 2007/0067* (2013.01)

(58) Field of Classification Search
CPC .... H02J 7/0021; H02J 7/00; H02J 2007/0067; Y02E 60/10
See application file for complete search history.

(56) References Cited

U.S. PATENT DOCUMENTS

| | | | |
|---|---|---|---|
| 2013/0130068 | A1 | 5/2013 | Song et al. |
| 2013/0138989 | A1 | 5/2013 | Jang et al. |
| 2013/0234672 | A1 | 9/2013 | Kubota et al. |
| 2013/0335030 | A1 | 12/2013 | Joe et al. |
| 2015/0008885 | A1 | 1/2015 | Yoshida |
| 2015/0051854 | A1 | 2/2015 | Joe et al. |
| 2015/0066407 | A1 | 3/2015 | Joe et al. |
| 2017/0009667 | A1 | 1/2017 | Asami et al. |
| 2017/0123011 | A1 | 5/2017 | Cha et al. |

FOREIGN PATENT DOCUMENTS

| | | | |
|---|---|---|---|
| CN | 102854470 | A | 1/2013 |
| CN | 103185867 | A | 7/2013 |
| CN | 103762624 | A | 4/2014 |
| CN | 104395771 | A | 3/2015 |
| CN | 104396082 | A | 3/2015 |
| CN | 104569827 | A | 4/2015 |
| CN | 104662432 | A | 5/2015 |
| JP | 2006280194 | A | 10/2006 |
| JP | 2012122787 | A | 6/2012 |
| JP | 2015210182 | A | 11/2015 |
| JP | 5949806 | B2 | 7/2016 |
| KR | 1998017339 | A | 9/1999 |
| KR | 100531855 | B1 | 11/2005 |
| KR | 20110016308 | A | 2/2011 |
| KR | 20110077194 | A | 7/2011 |
| KR | 20120076744 | A | 7/2012 |
| KR | 101398465 | B1 | 5/2014 |
| KR | 20160071564 | A | 6/2016 |
| KR | 20160094882 | A | 8/2016 |

OTHER PUBLICATIONS

ScienceDirect_Search_Results, Jan. 16, 2021, 6 pp. (Year: 2021).*
Chinese Search Report for Appllication No. 201780041596.1 dated Jun. 3, 2020, 3 pages.
Hu, et al., "Evaluation of the SOC for Battery Management System of Hybrid Electric Vehicle," Journal of Chongqing University, Apr. 2003, pp. 20-23. vol. 26, No. 4, English abstract only.
Yu, et al., "Application of Battery Management System in Electric Vehicles," Shandong Science, Jun. 2010, pp. 87-91, vol. 23, No. 3, English abstract only.
Search report from International Application No. PCT/KR2017/011551, dated Jan. 18, 2018.
Gregory L. Plett, "Extended Kalman filtering for battery management systems of LiPB-based HEV battery packs Part 3. State and parameter estimation," Journal of Power Sources 134 (2004) pp. 277-292.
Gregory L. Plett, "Extended Kalman filtering for battery management systems of LiPB-based HEV battery packs Part 2. Modeling and identification," Journal of Power Sources 134 (2004) pp. 262-276.
Gregory L. Plett, "Extended Kalman filtering for battery management systems of LiPB-based HEV battery packs Part 1. Background," Journal of Power Sources 134 (2004) pp. 252-261.

* cited by examiner

BATTERY MANAGEMENT APPARATUS AND METHOD THEREOF

CROSS-REFERENCE TO RELATED APPLICATIONS

The present application is a national phase entry under 35 U.S.C. § 371 of International Application No. PCT/KR2017/011551 filed Oct. 18, 2017, which claims priority to Korean Patent Application No. 10-2016-0164606 filed in the Republic of Korea on Dec. 5, 2016, all of which are incorporated herein by reference.

TECHNICAL FIELD

The present disclosure relates to a battery management apparatus and method, and more particularly, to an apparatus and method that when the voltage of a battery enters a voltage drop range or a voltage rise range, predicts the time required for the voltage of the battery to reach an upper voltage limit corresponding to overcharge or a lower voltage limit corresponding to overdischarge from the current time, and adjusts the output parameter.

BACKGROUND ART

Batteries can be repeatedly charged and discharged, and thus they are used as a source of power in various fields. For example, lithium ion batteries area used in handheld devices such as mobile phones, laptop computers, digital cameras, video cameras, tablet computers and electric tools, as well as various types of electric power systems including e-bikes, electric motorcycles, electric vehicles, hybrid electric vehicles, electric ship and electric aircraft.

A battery is connected to a load device through a power conversion device such as an inverter. The load device refers to any device using power stored in the above-mentioned battery. The load device includes a control system. The control system receives the output parameter of the battery from a battery management system (BMS) via communication.

The output parameter is an indication of the discharge performance or the charge performance of the battery, and is updated based on the state of charge and the temperature of the battery. The output parameter includes information associated with a maximum current value that may be permitted to flow through the battery when the battery is discharged or charged or an allowed output value (power) calculated therefrom.

When the control system receives the output parameter from the BMS system, the control system controls the charge and discharge of the battery in the range of the output parameter. That is, the control system regulates the output of the battery below the allowed output value or the size of the charge or discharge current below the maximum current value by controlling the power conversion device.

Meanwhile, the voltage of the battery rapidly changes when it is close to a lower limit of discharge voltage or an upper limit of charge voltage preset through experiments. Here, the lower limit of discharge voltage is for preventing overdischarge, and the upper limit of charge voltage is for preventing overcharge.

FIG. 1 is a graph showing voltage changes appearing during discharging with the constant current of 360 A when the state of charge of a lithium battery with the capacity of 360 Ah is 20%.

As can be seen through the graph shown in FIG. 1, when the voltage of the battery reaches the voltage indicated by A that is higher than the lower limit of discharge voltage ($V_{min}$), the voltage rapidly drops at a high rate.

A sharp change in voltage also takes place in a situation in which the battery is charged. That is, as the voltage of the battery is closer to the upper limit of charge voltage, the voltage rapidly rises at a high rate. One of the causes of the sharp change in battery voltage is a sharp change in internal resistance dependent on the state of charge of the battery.

The sharp change in battery voltage indicates a risk that the battery will be overcharged or overdischarged soon. Accordingly, the BMS needs to predict the time left until the battery actually reaches the lower limit of discharge voltage or the upper limit of charge voltage from the current time. Optionally, the BMS may appropriately derate the output parameter provided to the control system based on the predicted time, to prevent situations in which the voltage of the battery is lower than the lower limit of discharge voltage or higher than the upper limit of charge voltage.

DISCLOSURE

Technical Problem

The present disclosure is designed under the background of the related art as described above, and therefore, the present disclosure is directed to providing an apparatus that when the voltage of a battery reaches a preset voltage change range, predicts the remaining time or the time required for the voltage of the battery to reach a lower limit of discharge voltage or an upper limit of charge voltage, and maintains or adjusts the output parameter of the battery based on the predicted remaining time, and a method thereof.

Technical Solution

To achieve the above-described object, a battery management apparatus according to an aspect of the present disclosure includes a voltage measuring unit configured to measure a voltage of a battery, a current measuring unit configured to measure a current of the battery, and a control unit configured to determine a state of charge based on at least one of the measured voltage or the measured current during discharging of the battery. The control unit is configured to determine if the voltage of the battery reaches a preset discharge threshold voltage, when the voltage of the battery is determined to have reached the discharge threshold voltage, record an arrival time at which the voltage of the battery reached the discharge threshold voltage, and determine a discharge profile based on the state of charge, wherein data defining the discharge profile is recorded through previous experimentation using a predetermined level of constant current, determine a maximum value of resistance change ratio preset for the discharge profile, predict a remaining time until the voltage of the battery reaches a lower limit of discharge voltage from a current time based on each of (i) the discharge threshold voltage, (ii) the lower limit of discharge voltage that is preset lower than the discharge threshold voltage, (iii) the current of the battery measured at the current time that is later than the arrival time, and (iv) the maximum value of resistance change ratio, and output a message indicating the predicted remaining time.

Additionally, the control unit is configured to predict the remaining time using the following equation:

$$t_r = \frac{(V_{min} - V_{threshold})}{I_0 \left[\frac{dR}{dt}\right]_{max}}$$

in which $I_0$ is the current of the battery measured at the arrival time, $V_{min}$ is the lower limit of discharge voltage, $V_{threshold}$ is the discharge threshold voltage, $(dR/dt)_{max}$ is the maximum value of resistance change ratio, and $t_r$ is the remaining time.

Optionally, the control unit is configured to calculate an average value of absolute values of the current of the battery measured at least a predetermined number of times for a predetermined time in the past on the basis of the arrival time, determine a weight for correcting the remaining time based on the average value and the constant current, and predict the remaining time using the following equation:

$$t_r = \frac{K(V_{min} - V_{threshold})}{I_0 \left[\frac{dR}{dt}\right]_{max}}$$

in which $I_0$ is the current of the battery measured at the arrival time, $V_{min}$ is the lower limit of discharge voltage, $V_{threshold}$ is the discharge threshold voltage, $(dR/dt)_{max}$ is the maximum value of resistance change ratio, K is the weight, and $t_r$ is the remaining time. Preferably, the control unit may be configured to when the average value is larger than the constant current by a first reference value or more, allocate a value that is smaller than 1 and larger than 0 to the weight, when the average value is smaller than the constant current by a second reference value or more, allocate a value that is larger than 1 to the weight, and when the average value is smaller than a value obtained by adding the first reference value to the constant current and larger than a value obtained by subtracting the second reference value from the constant current, allocate 1 to the weight.

Along with this or separately, the battery management apparatus may further include a temperature measuring unit configured to measure a temperature of the battery. In this case, the control unit may be configured to determine the state of charge further based on the measured temperature during discharging of the battery.

Additionally, the control unit may be configured to determine if the predicted remaining time is equal to or more than an output maintenance time, and when the predicted remaining time is determined to be less than the output maintenance time, determine a target derating current value in derating mode. In this instance, the output maintenance time may be requested from a load device communicably connected to the battery management apparatus.

Additionally, the control unit is configured to determine the target derating current value using the following equation:

$$I_{derate} = \frac{V_{min} - V_{threshold} + I_0 \times R_0}{R_0 + \left[\frac{dR}{dt}\right]_{max} t_m}$$

in which $I_0$ is the current of the battery measured at the arrival time, $V_{min}$ is the lower limit of discharge voltage, $V_{threshold}$ is the discharge threshold voltage, $R_0$ is a preset internal resistance of the battery, $t_m$ is the output maintenance time, $(dR/dt)_{max}$ is the maximum value of resistance change ratio, and $I_{derate}$ is the target derating current value.

Preferably, the control unit may be configured to periodically update the remaining time until the voltage of the battery is higher than the discharge threshold voltage reached at the arrival time.

According to circumstances, the control unit may be configured to, when the battery starts charging again before the voltage of the battery is higher than the discharge threshold voltage reached at the arrival time, stops predicting the remaining time, and stores a latest predicted remaining time in a memory.

A battery management method according to another aspect of the present disclosure includes measuring a voltage and a current of a battery, determining a state of charge based on at least one of the measured voltage or the measured current during discharging of the battery, determining if the voltage of the battery reaches a preset discharge threshold voltage, when the voltage of the battery is determined to have reached the discharge threshold voltage, recording an arrival time at which the voltage of the battery reached the discharge threshold voltage, and determining a discharge profile based on the state of charge, wherein data defining the discharge profile is recorded through previous experimentation using a predetermined level of constant current, determining a maximum value of resistance change ratio preset for the discharge profile, predicting a remaining time until the voltage of the battery reaches a lower limit of discharge voltage from a current time based on each of (i) the discharge threshold voltage, (ii) the lower limit of discharge voltage that is preset lower than the discharge threshold voltage, (iii) the current of the battery measured at the current time that is later than the arrival time, and (iv) the maximum value of resistance change ratio, and outputting a message indicating the predicted remaining time.

Additionally, the method may further include predicting the remaining time using the following equation:

$$t_r = \frac{(V_{min} - V_{threshold})}{I_0 \left[\frac{dR}{dt}\right]_{max}}$$

in which $I_0$ is the current of the battery measured at the arrival time, $V_{min}$ is the lower limit of discharge voltage, $V_{threshold}$ is the discharge threshold voltage, $(dR/dt)_{max}$ is the maximum value of resistance change ratio, and $t_r$ is the remaining time.

Additionally, the method may further include calculating an average value of absolute values of the current of the battery measured at least a predetermined number of times over a predetermined duration in the past on the basis of the arrival time, determining a weight for correcting the remaining time based on the average value and the constant current, and predicting the remaining time using the following equation:

$$t_r = \frac{K(V_{min} - V_{threshold})}{I_0 \left[\frac{dR}{dt}\right]_{max}}$$

in which $I_0$ is the current of the battery measured at the arrival time, $V_{min}$ is the lower limit of discharge voltage, $V_{threshold}$ is the discharge threshold voltage, $(dR/dt)_{max}$ is the maximum value of resistance change ratio, K is the weight, and $t_r$ is the remaining time.

Additionally, the method may further include, when the average value is larger than the constant current by a first reference value or more, allocating a value that is smaller than 1 and larger than 0 to the weight, when the average value is smaller than the constant current by a second reference value or more, allocating a value that is larger than 1 to the weight, and when the average value is smaller than a value obtained by adding the first reference value to the constant current and larger than a value obtained by subtracting the second reference value from the constant current, allocating 1 to the weight.

Additionally, the method may further include measuring a temperature of the battery, whereby determining the state of charge is further based on the measured temperature during discharging of the battery.

Additionally, the method may further include requesting an output maintenance time, determining if the predicted remaining time is equal to or more than the output maintenance time, and when the predicted remaining time is determined to be less than the output maintenance time, determining a target derating current value in derating mode.

Additionally, the method may further include determining the target derating current value using the following equation:

$$I_{derate} = \frac{V_{min} - V_{threshold} + I_0 \times R_0}{R_0 + \left[\frac{dR}{dt}\right]_{max} t_m}$$

in which $I_0$ is the current of the battery measured at the arrival time, $V_{min}$ is the lower limit of discharge voltage, $V_{threshold}$ is the discharge threshold voltage, $R_0$ is a preset internal resistance of the battery, $t_m$ is the output maintenance time, $(dR/dt)_{max}$ is the maximum value of resistance change ratio, and $I_{derate}$ is the target derating current value.

Additionally, the method may further include periodically updating the remaining time until the voltage of the battery is higher than the discharge threshold voltage reached at the arrival time.

Additionally, the method may further include, when the battery starts charging again before the voltage of the battery is higher than the discharge threshold voltage reached at the arrival time, stopping predicting the remaining time, and storing a latest predicted remaining time in a memory.

Advantageous Effects

According to at least one of the embodiments of the present disclosure, when the voltage of a battery reaches a preset voltage change range, the remaining time or the time required for the voltage of the battery to reach a lower limit of discharge voltage or an upper limit of charge voltage may be predicted, and the output parameter of the battery may be maintained or adjusted based on the predicted remaining time.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate an embodiment of the present disclosure and together with the following detailed description, serve to provide further understanding of the technical aspects of the present disclosure, and thus, the present disclosure is not construed as being limited to the statements in such drawings.

MODE FOR CARRYING OUT THE INVENTION

Figure 1:
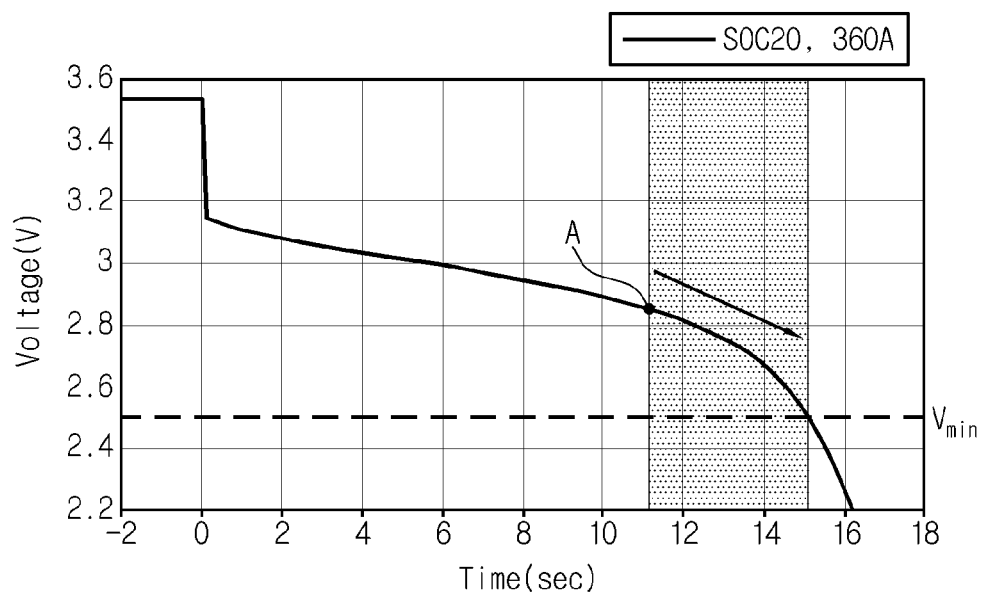
FIG. 1 a conventional discharge profile showing voltage change modeling during discharging with the constant current of 360 A when the state of charge of a lithium battery with the capacity of 36 Ah is 20%.

Hereinafter, embodiments of the present disclosure will be described with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define terms appropriately for the best explanation. Therefore, the embodiments described herein and illustrations shown in the drawings are just an embodiment of the present disclosure, but not intended to fully describe the technical aspects of the present disclosure, so it should be understood that other equivalents and modifications could be made thereto at the time the invention was made.

In the embodiments described below, a battery refers to a lithium battery. Here, the lithium battery refers collectively to batteries in which lithium ions act as working ions during charging and discharging, causing electrochemical reactions at the positive electrode and the negative electrode.

Meanwhile, it should be interpreted as that even though the name of the battery changes depending on the type of electrolyte or separator used in the lithium battery, the type of packaging used to package the battery and the internal or external structure of the lithium battery, the lithium battery covers any battery using lithium ions as working ions.

The present disclosure may be also applied to batteries other than lithium batteries. Accordingly, it should be interpreted as that the present disclosure covers any battery to which the technical aspects of the present disclosure may be applied irrespective of the type, even though working ions are not lithium ions.

Additionally, the battery is not limited to the number of elements that constitutes it. Accordingly, it should be interpreted that the battery includes a unit cell including an assembly of positive electrode/separator/negative electrode and an electrolyte in a packaging as well as an assembly including unit cells connected in series and/or in parallel, a module including assemblies connected in series and/or in parallel, a pack including modules connected in series and/or in parallel, and a battery system including packs connected in series and/or in parallel.

Figure 2:
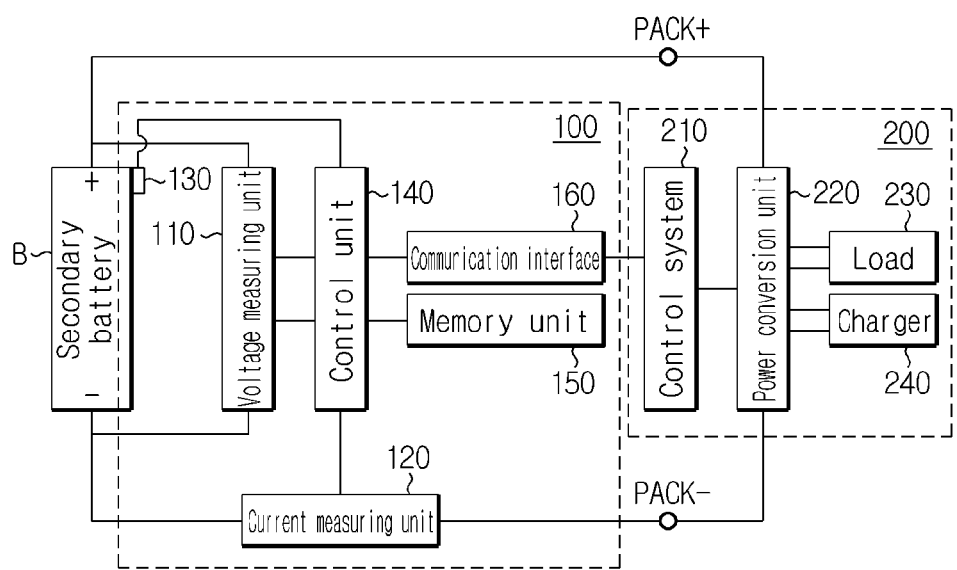
FIG. 2 is a block diagram of an output parameter adjustment system of a battery according to an embodiment of the present disclosure.

FIG. 2 is a block diagram showing an battery management apparatus 100 according to an embodiment of the present disclosure.

Referring to FIG. 2, the apparatus 100 according to an embodiment of the present disclosure includes a voltage measuring unit 110, a current measuring unit 120 and a control unit 140, and optionally, may further include a temperature measuring unit 130. The apparatus 100 may derate the output parameter after the point in time in which the voltage of a battery B being discharged is equal to a preset discharge threshold voltage.

The battery B is electrically connected to a load device 200 through a high potential terminal (PACK+) and a low potential terminal (PACK−). The load device 200 refers to a device that operates with power outputted from the battery B.

The load device 200 includes a control system 210, a power conversion unit 220 and a load 230. Optionally, the load device 200 may further include a charger 240. The charger 240 may supply a charge current for charging the battery B to the battery B through the power conversion unit 220. The charger 240 may produce a charge current itself, and may produce a charge current by receiving power from a commercial power source.

In a preferred example, the load 230 may be a motor included an electric vehicle or a hybrid electric vehicle, and the power conversion unit 220 may be an inverter capable of bi-directional power conversion.

The control system 210 is a computing system that controls the overall operation of the load device 200. Particularly, the control system 210 controls the discharge of the battery B using the output parameter of the battery B provided by the control unit 140. That is, the control system 210 controls the discharge of the battery B by controlling the power conversion unit 220 based on the discharge condition corresponding to the output parameter.

The power conversion unit 220 transmits the discharge output of the battery B to the load 230. In this instance, the power conversion unit 220 may adjust the extent of power conversion under the control of the control system 210 so that the battery B may be discharged in the range of the output parameter.

On the contrary, the power conversion unit 220 may transmit the charge output supplied from the charger 240 to the battery B. In this instance, the power conversion unit 220 may adjust the extent of power conversion under the control of the control system 210 so that the battery B may be charged in the range of the output parameter.

The apparatus 100 according to the present disclosure may further include a memory unit 150. The memory unit 150 is not limited to a particular type of storage medium when it can record and delete information.

For example, the memory unit 150 may include RAM, ROM, register, hard disk, an optical recording medium or a magnetic recording medium.

The memory unit 150 may be electrically connected to the control unit 140 through, for example, a data bus, to allow the control unit 140 to access it.

Additionally, the memory unit 150 stores and/or updates and/or deletes and/or transmits programs including various types of control logics executed by the control unit 140 and/or data created when the control logic is executed.

The memory unit 150 can be logically divided into two or more, and may be included in the control unit 140 without limitations.

The voltage measuring unit 110 is electrically coupled with the control unit 140 to transmit and receive electrical signals. The voltage measuring unit 110 measures the voltage applied between the positive electrode and the negative electrode of the battery B at a time interval under the control of the control unit 140, and outputs a signal indicating the magnitude of the measured voltage to the control unit 140. The control unit 140 determines the voltage of the battery B from the signal outputted from the voltage measuring unit 110, and stores a value of the determined voltage in the memory unit 150. For example, the voltage measuring unit 110 may include a voltage measurement circuit commonly used in the art.

The current measuring unit 120 is electrically coupled with the control unit 140 to transmit and receive electrical signals. The current measuring unit 120 repeatedly measures the size of the current flowing through the battery B at a time interval under the control of the control unit 140 and outputs a signal indicating the size of the measured current to the control unit 140. The control unit 140 determines the size of the current from the signal outputted from the current measuring unit 120 and stores the determined current value in the memory unit 150. For example, the current measuring unit 120 may include a hall sensor or a sense resistor commonly used in the art.

The temperature measuring unit 130 is electrically coupled with the control unit 140 to transmit and receive electrical signals. The temperature measuring unit 130 repeatedly measures the temperature of the battery B at a time interval and outputs a signal indicating the magnitude of the measured temperature to the control unit 140. The control unit 140 determines the temperature of the battery B from the signal outputted from the temperature measuring unit 130 and stores a value of the determined temperature in the memory unit 150. For example, the temperature measuring unit 130 may include a thermocouple commonly used in the art.

The apparatus 100 according to the present disclosure may further include a communication interface 160. The communication interface 160 is an essential component for the control unit 140 to communicate with the control system 210 included in the load device 200.

The communication interface 160 includes any known communication interface that supports communication between two different systems. The communication interface may support wired or wireless communication. Preferably, the communication interface may support controller area network (CAN) communication or daisy chain communication.

The control unit 140 may determine the state of charge of the battery B by selectively using at least one of the voltage of the battery B measured by the voltage measuring unit 110 and the current of the battery B measured by the current measuring unit 120 and the temperature of the battery B measured by the temperature measuring unit 130.

For example, the state of charge of the battery B may be determined by accumulating the current values periodically measured through the current measuring unit 120. This method is also known as Ampere-hour counting method, and its detailed description is omitted herein. As another example, the state of charge of the battery B may be determined by determining the open-circuit voltage based on the voltage values periodically measured through the voltage measuring unit 110 and referring to an OCV-SOC table pre-stored in the memory. As still another example, the state of charge may be determined using an adaptive algorithm such as the extended Kalman filter based on circuit modeling of the battery B. For the state of charge estimation using the extended Kalman filter, for example, a reference may be made to Gregory L. Plett's paper "Extended Kalman filtering for battery management systems of LiPB-based HEV battery packs Parts 1, 2 and 3" (Journal of Power Source 134, 2004, 252-261), the disclosure of which may be at least incorporated herein by reference.

Of course, besides the Ampere-hour counting method or the extended Kalman filter described above, the state of charge may be determined by other know methods for estimating the state of charge selectively using the voltage, temperature and current of the battery B.

The control unit 140 monitors the voltage level of the battery B measured by the voltage measuring unit 110 during discharging of the battery B.

The control unit 140 differently determines the output parameter of the battery B depending on the voltage level of the battery B. Specifically, when the voltage of the battery B being discharged lies in a plateau voltage range, the control unit 140 may determine the output parameter in normal mode. On the contrary, when the voltage of the battery B enters a voltage drop range or a voltage rise range beyond the plateau voltage range, the control unit 140 may determine the output parameter in derating mode. In this instance, the plateau voltage range and the voltage drop range may be identified on the basis of a preset discharge threshold voltage. Additionally, the plateau voltage range and the voltage rise range may be identified on the basis of a preset charge threshold voltage that is higher than the discharge threshold voltage. That is, the voltage drop range is a range corresponding to the voltage range below the discharge threshold voltage, the voltage rise range is a range corresponding to the voltage range that is equal to or larger than the charge threshold voltage, and the plateau voltage range is a range corresponding to the voltage range that is larger than the discharge threshold voltage and smaller than the charge threshold voltage.

The level of each of the discharge threshold voltage and the charge threshold voltage may be a value preset in consideration of two time factors. One time factor is a delay time taken to actually reflect the output parameter on the control of the battery B after the output parameter is transmitted from the control unit 140 to the control system 210. The other time factor is an output maintenance time during which the output of the battery B based on the output parameter should be at least maintained.

The delay time changes depending on the operating speed of the control unit 140 and the control system 210 and a communication rate therebetween. The delay time factor may be a time value within a few seconds, for example, 2 seconds.

The output maintenance time is requested from the load device 200 communicably connected to the apparatus 100 or the load 230 included therein, and may change depending on the output characteristics necessary for the operation of the load 230. The output maintenance time may be a time value within a few seconds that is longer than the delay time, for example, 6 seconds.

A method of setting the discharge threshold voltage in consideration of the delay time and the output maintenance time is as described below with reference to FIG. 3, and the charge threshold voltage may be also set in a similar way.

First, constant current discharge experiments may be carried out at room temperature (25 degrees) for each state of charge of the battery B to obtain a plurality of discharge profiles.

Figure 3:
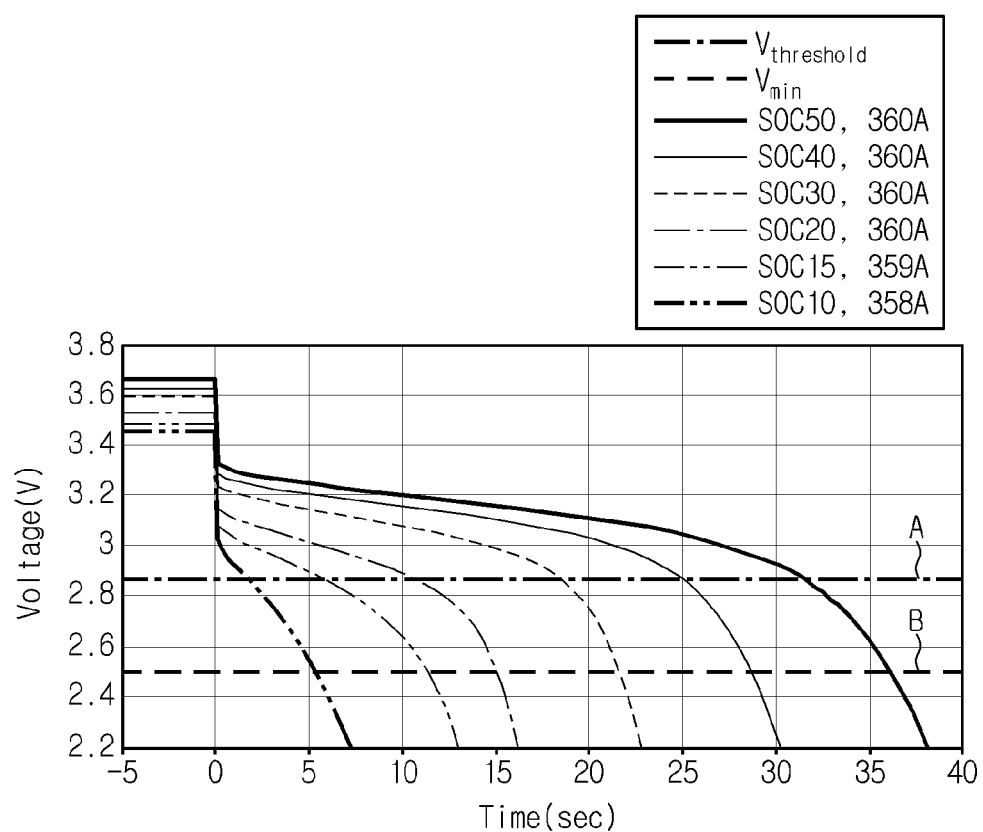
FIG. 3 are graphs showing the results of measuring discharge profiles for six lithium batteries with the same capacity of 36 Ah and different states of charge of 10%, 15%, 20%, 30%, 40% and 50%.

FIG. 3 are graphs showing the results of measuring discharge profiles for six lithium batteries with the same maximum capacity of 36 Ah and different states of charge of 10%, 15%, 20%, 30%, 40% and 50%. As it goes from left to right, the state of charge of the battery B on the measured discharge profiles is larger.

The magnitude of the discharge current applied to each constant current discharge experiment is a maximum discharge current value corresponding to the state of charge and the temperature of the battery B. The maximum discharge current value corresponding to certain state of charge and temperature is a discharge current value that allows the voltage of the battery B to reach the lower limit of discharge voltage ($V_{min}$) when pulse discharging the battery B by the hybrid pulse power characterization (HPPC) method.

Preferably, when the maximum discharge current value determined by the HPPC method is larger than the upper limit of discharge current value set for safety of the battery B, the maximum discharge current value may be replaced with the upper limit of discharge current value.

In the constant current discharge experiment for obtaining the discharge profiles shown in FIG. 3, the upper limit of discharge current value was set to 360 A.

In FIG. 3, the maximum discharge current value applied when obtaining each discharge profile is indicated on the right side of the graph. That is, the maximum discharge current values corresponding to the state of charge of 20%, 30%, 40% and 50% are equally 360 A. Because the maximum discharge current value determined by the HPPC method exceeds 360 A set as the upper limit of discharge current value, the maximum discharge current value is replaced with the upper limit of discharge current value. Instead, when the state of the battery B is 10% and 15%, because the maximum discharge current value determined by the HPPC method is smaller than the upper limit of discharge current value 360 A, the maximum discharge current value determined by the HPPC method is applied as it is.

In FIG. 3, the horizontal line A represents the level of the discharge threshold voltage ($V_{threshold}$) preset in consideration of the delay time and the output maintenance time, and the horizontal line B represents the level of the lower limit of discharge voltage ($V_{min}$).

Preferably, the level of the discharge threshold voltage $V_{threshold}$ may be set such that a time difference between two points at which each discharge profile meets the horizontal lines A and B is greater than the delay time and less than the output maintenance time.

When the level of the discharge threshold voltage $V_{threshold}$ is set as above, even though the point in time in which the output parameter determined in derating mode is applied is delayed as much as the delay time, a phenomenon in which the voltage of the battery B suddenly drops below the lower limit of discharge voltage may be prevented. Additionally, when the time taken until the voltage of the battery B reaches the lower limit of discharge voltage ($V_{min}$) is smaller than the output maintenance time, it is possible to ensure a minimum of output maintenance time by derating the output of the battery B.

Figure 4:
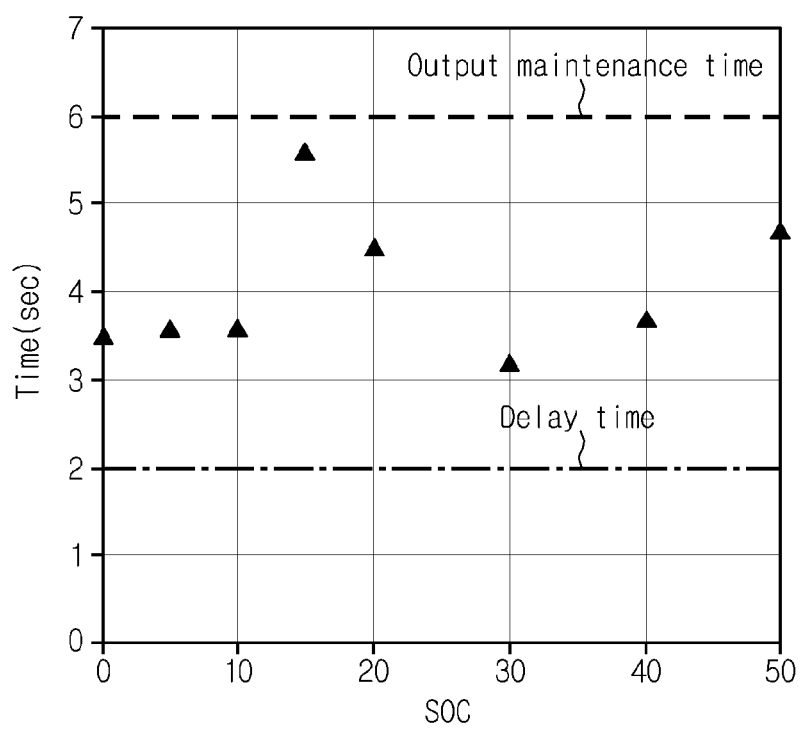
FIG. 4 is a graph showing a calculated time difference between two points at which each discharge profile shown in FIG. 3 meets horizontal dotted lines A and B.

FIG. 4 shows the calculated time differences (see the mark ▲) between two points at which each discharge profile shown in FIG. 3 meets the horizontal lines A and B. The time is 2 seconds, the output maintenance time is set to 6 seconds, and the level of the discharge threshold voltage is set to 2.87V. Referring to FIG. 4, it can be seen that the level of the discharge threshold voltage ($V_{threshold}$) indicated by the horizontal line A in FIG. 3 satisfies the above-mentioned condition well. Accordingly, when the voltage of the battery B reaches 2.87V, if the output parameter is determined in derating mode and the determined output parameter is provided to the control system 210 of the load device 200, the output of the battery B may be maintained for a minimum of 6 seconds. Additionally, even though there is the delay time of 2 seconds until the output parameter is reflected on the load device 200, sudden drop of the voltage of the battery B below the lower limit of discharge voltage ($V_{min}$) may be prevented.

In the present disclosure, the discharge profiles shown in FIG. 3 are obtained under room temperature condition. However, for all the plurality of discharge profiles obtained for each temperature by additionally obtaining the discharge profiles for each temperature condition included in the operating temperature range of the battery B, it is obvious to those skilled in the art that it is preferred to determine the level of the discharge threshold voltage such that they satisfy the above-described condition. Additionally, data defining each discharge profile derived through previous experiments may be recorded in the memory. That is, data defining each discharge profile may be derived through previous experiments using a predetermined level of constant current and recorded in the memory.

That is, it is preferred to set the level of the discharge threshold voltage ($V_{threshold}$) such that the time difference between two points at which each discharge profile measured for each state of charge and each temperature meets the horizontal lines A and B is larger than the delay time and smaller than the output maintenance time.

The control unit 140 determines the output parameter in normal mode when the current voltage of the battery B measured through the voltage measuring unit 110 is larger than the preset discharge threshold voltage $V_{threshold}$. The output parameter determined during discharging includes at least one of the maximum discharge current value and the allowed output value of the battery B. The control unit 140 may determine the maximum discharge current value using the power map stored in the memory unit 150. The power map has a data structure that is the reference to the maximum discharge current value based on the state of charge and the temperature of the battery B.

The allowed output value may be determined by the following Equation 1. In Equation 1, the maximum discharge current value is the current factor $I_{max}$.

Allowed output $P=V_{min}I_{max}$                            <Equation 1>

In Equation 1, $V_{min}$ denotes the lower limit of discharge voltage of the battery B and is a preset voltage factor. $I_{max}$ is a current factor that changes depending on the state of charge and the temperature of the battery B, and corresponds to the maximum discharge current value of the battery B under certain state of charge and temperature condition. $I_{max}$ is a value that can be mapped from the power map stored in the memory unit 150 using the state of charge and the temperature of the battery B.

Meanwhile, when the voltage of the battery B measured through the voltage measuring unit 110 drops below the discharge threshold voltage ($V_{threshold}$) (i.e., belonging to the voltage drop range), the control unit 140 shifts the normal mode to derating mode and determines the output parameter in derating mode. In this instance, prior to or simultaneously with the operation of determining the output parameter, the control unit 140 may predict how much time is left until the voltage of the battery B reaches the lower limit of discharge voltage ($V_{min}$). Hereinafter, the time left until the voltage of the battery B being discharged reaches the lower limit of discharge voltage ($V_{min}$) from the current time is referred to as 'remaining time'.

The control unit 140 may predict the remaining time $t_r$ using the following Equation 2.

$$t_r = \frac{K(V_{min} - V_{threshold})}{I_0 \left[\frac{dR}{dt}\right]_{max}} \qquad <\text{Equation 2}>$$

In Equation 2, K may be fixed to 1. Alternatively, in Equation 2, K is a sort of weight, and may be a value that is changed by the control unit 140 according to a preset rule. The control unit 140 may output a remaining time guidance message notifying the predicted remaining time $t_r$. The remaining time guidance message may be transmitted to an information guidance device (not shown) provided in the load device 200 or an external device (e.g., a vehicle) through the communication interface 160. The information guidance device may output a visual and/or audible signal to a user based on the remaining time guidance message.

Additionally, the output parameter determined by the control unit 140 in derating mode includes at least one of a target derating current value and a target derating output value of the battery B. The control unit 140 may determine the target derating current value $I_{derate}$ by the following Equation 3.

$$I_{derate} = \frac{V_{min} - V_{threshold} + I_0 \times R_0}{R_0 + \left[\frac{dR}{dt}\right]_{max} t_m} \qquad <\text{Equation 3}>$$

Figure 5:
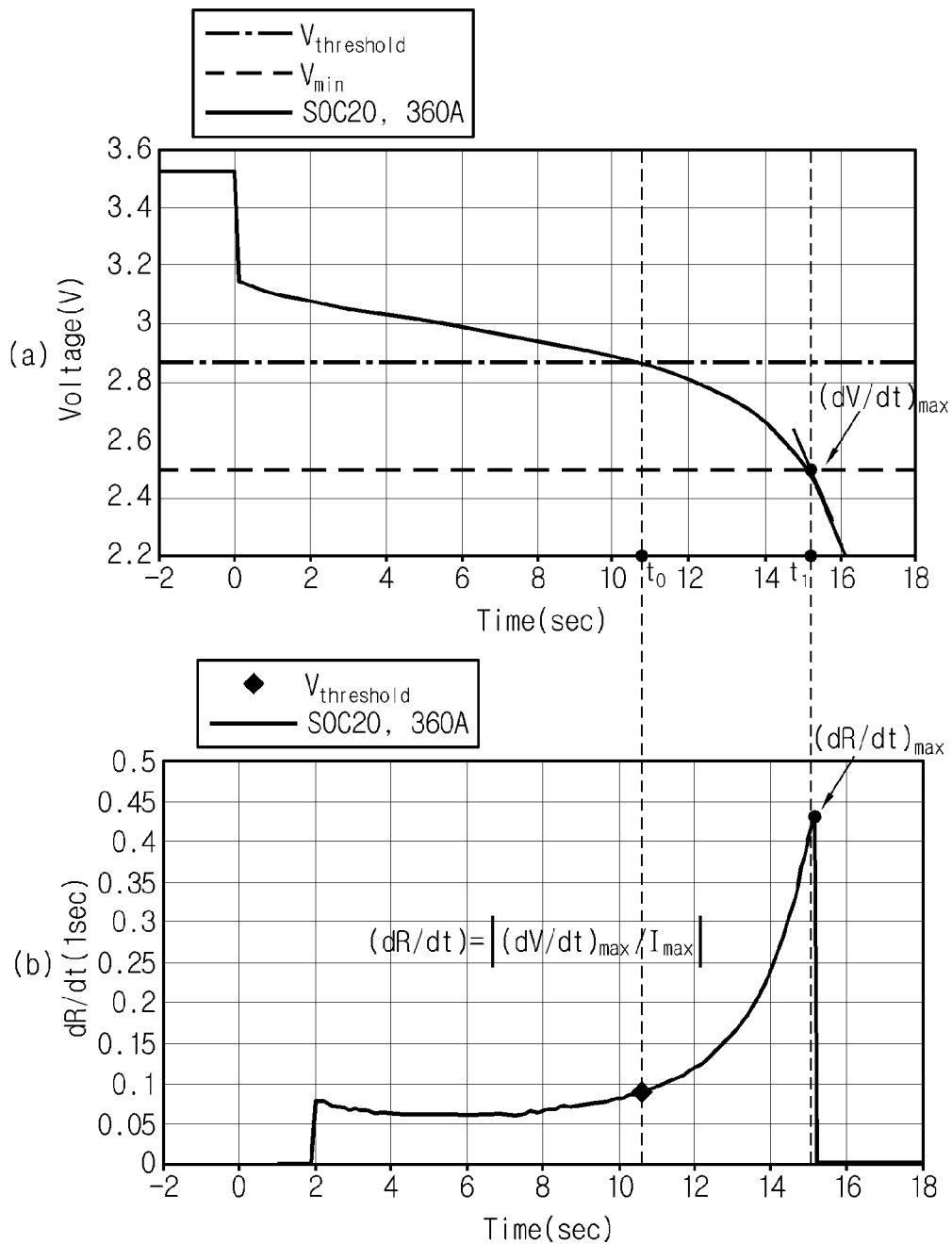
FIG. 5 is a diagram illustrating parameters of Equations used when determining a target derating current value in an embodiment of the present disclosure.

FIG. 5 is a diagram illustrating the parameters included in Equation 2 and Equation 3.

The discharge profile shown in the graph (a) of FIG. 5 is a discharge profile obtained by carrying out constant current discharge experiments with 360 A ($I_{max}$) under 25 degrees condition when the state of charge of the battery B with the capacity of 36 Ah is 20%. $I_{max}$ is the maximum discharge current value allowed when the state of charge of the battery B is 20%.

The graph (b) of FIG. 5 shows a resistance change ratio (dR/dt) over time when the battery B with the state of charge of 20% is discharged with 360 A. According to the Ohm's law, V=IR and I is constant $I_{max}$. When the two sides of V=IR are differentiated by time, $dV/dt=I_{max}dR/dt$, and dR/dt is substantially the same as $(dV/dt)/I_{max}$. That is, dR/dt may be determined using the voltage change ratio (dV/dt) of the discharge profile.

Referring to FIG. 5, in Equation 2 and Equation 3, $V_{min}$ is a preset lower limit of discharge voltage, and $V_{threshold}$ is a preset discharge threshold voltage. $R_0$ is an internal resistance value of the battery B, and is a constant value preset through experiments. $V_{min}$, $V_{threshold}$ and $R_0$ may be pre-stored in the memory unit 150.

$I_0$ is a current value measured by the current measuring unit 120 at the point in time in which the voltage of the battery B being discharged reaches the discharge threshold voltage ($V_{threshold}$) or thereafter.

(dR/dt)$_{max}$ is the maximum value of (dR/dt) appearing in the voltage drop range, and as shown in the graph (b), corresponds to a value obtained by dividing an absolute value of a primary differentiation value (a slope of a tangent line) at the point in time in which the voltage of the battery B reaches V$_{min}$ by the size of the discharge current I$_{max}$. Data associated with (dR/dt)$_{max}$ may be pre-determined using the discharge profiles measured for each state of charge and each temperature of the battery B, and the data associated with (dR/dt)$_{max}$ defined for each state of charge and each temperature may be pre-stored in the memory unit 150.

(t$_1$−t$_0$) is the total period of time from the point in time to in which the voltage of the battery B reaches the discharge threshold voltage to the point in time t$_1$ in which the voltage of the battery B reaches the lower limit of discharge voltage for each discharge profile, and may be set differently depending on the state of charge and the temperature corresponding to the discharge profile of the battery B. The control unit 140 may allocate the output maintenance time t$_m$ to (t$_1$−t$_0$) to determine I$_{derate}$ of Equation 3 before actually reaching t$_1$.

Equations 2 and 3 may be induced as below. The voltage of the battery B may be modelled equivalently by a circuit in which the open-circuit voltage component changing depending on the state of charge and the temperature of the battery B, the internal resistance (R$_0$) and the RC circuit are connected in series.

According to the circuit modeling, the voltage V of the battery B may be represented by the sum of three voltage components as in the following Equation 4. That is, the three voltage components may be represented by the sum of the open-circuit voltage component OCV that is determined uniquely based on the state of charge, the voltage component IR$_0$ applied to the two ends of the internal resistance R$_0$ when the current I flows, and the voltage component I$_{RC}$R applied to the two ends of the RC circuit when the current I$_{RC}$ flows in the resistance R of the RC circuit.

$$V = OCV + IR_0 + I_{RC}R \qquad \text{<Equation 4>}$$

When the two sides of the above Equation 3 is differentiated by the time t, the following Equation 5 may be obtained.

$$dV/dt = dOCV/dt + (dI/dt)R_0 + (dI_{RC}/dt)R + I_{RC}(dR/dt) \qquad \text{<Equation 5>}$$

When it is assumed that the state of charge of the battery B and the current I$_{RC}$ flowing in the resistance of the RC circuit are constant for a very short time, dOCV/dt and dI$_{RC}$/dt are 0, and Equation 5 may be approximated as shown in the following Equation 6.

$$dV/dt = (dI/dt)R_0 + I_{RC}(dR/dt) \qquad \text{<Equation 6>}$$

Meanwhile, assume that the current of the battery B measured at t$_0$ is I$_0$. Additionally, assume that the current of the battery B to be measured at t$_1$ is I$_1$. Additionally, assume that for the duration of from t$_0$ to t$_1$, I$_{RC}$ is equal to I$_1$ and (dR/dt) is constant. Under this definition, when the two sides of Equation 6 are integrated in the range of from t$_0$ to t$_1$, the following Equation 7 is obtained.

$$V_{min} - V_{threshold} = (I_1 - I_0)R_0 + I_1(dR/dt)(t_1 - t_0) \qquad \text{<Equation 7>}$$

Meanwhile, because it is impossible to actually measure the I$_1$ value of Equation 7 before the point in time t$_1$ in which the voltage of the battery B reaches V$_{min}$, the assumption is made that the discharge current of the battery B is constantly maintained at I$_0$ from t$_0$ to t$_1$, and when Equation 7 is written with regard to (t$_1$−t$_0$), Equation 8 is obtained.

$$t_1 - t_0 = \frac{(V_{min} - V_{threshold})}{I_0 \left[\frac{dR}{dt}\right]} \qquad \text{<Equation 8>}$$

In Equation 8, when (dR/dt)$_{max}$ is allocated to (dR/dt) and (t$_1$−t$_0$)=t$_r$, the same form as Equation 2 is given.

Meanwhile, when Equation 7 is written with respect to I$_1$, Equation 9 is obtained.

$$I_1 = \frac{V_{min} - V_{threshold} + I_0 \times R_0}{R_0 + \left[\frac{dR}{dt}\right] \times (t_1 - t_0)} \qquad \text{<Equation 9>}$$

In Equation 9, when (dR/dt)$_{max}$ is allocated to (dR/dt) and t$_m$ is allocated to (t$_1$−t$_0$), Equation 7 is finally written in the form of Equation 3.

As above, the reason that (dR/dt)$_{max}$ is allocated to (dR/dt) of Equation 8 and Equation 9 is to conservatively calculate the remaining time t$_r$ and the target derating current value I$_{derate}$ so as to prevent the state of overcharge.

In Equation 8, when the (dR/dt)$_{max}$ value is allocated to the (dR/dt) value, the denominator value of Equation 8 is maximum in the allowed range, and thus, when K of Equation 2 is a constant value, t$_r$ is minimum. In this instance, K in Equation 2 is a factor for reflecting the level of the current at to or at least one of the subsequent points in time on the calculation of t$_r$. That is, K may be a value that changes depending on at least one of the direction and size of the current flowing through the battery B. Although the graph of FIG. 5 shows the discharge profiles at the constant current, the current flowing in the battery B may not be constant during discharging of the battery B. Accordingly, to predict and calculate the remaining time t$_r$ more accurately, it is preferred to use the current at least measured at the current time in calculating t$_r$.

For example, when an average value of absolute values of the current measured a predetermined number or more for a predetermined time in the past from a certain point in time belonging to the voltage drop range is larger than the constant current used to obtain the discharge profile by a first reference value or more, the control unit 140 may gradually or continuously reduce the value of K from 1 toward 0 based on the average value. As another example, when an average value of absolute values of the current measured a predetermined number or more for a predetermined time in the past from a certain point in time belonging in the voltage drop range is smaller than the constant current used to obtain the discharge profile by a second reference value or more, the control unit 140 may gradually or continuously increase the value of K from 1 based on the average value.

When a relationship between the average value and the constant current does not correspond to both the above two cases, the control unit 140 may allocate 1 to K. That is, when the average value is smaller than a value obtained by adding the first reference value to the constant current and larger than a value obtained by subtracting the second reference value from the constant current, the control unit 140 may allocate 1 to K.

Additionally, in Equation 9, when the (dR/dt)$_{max}$ value is allocated to the (dR/dt) value, the denominator value in Equation 9 is maximum in the allowed range, and thus I$_{derate}$ in Equation 3 is minimum. Thus, between t$_0$ and t$_1$, the level of the current flowing through the battery B is sufficiently smaller than the maximum discharge current value mapped from the power map, and even though the voltage of the battery B drops below the discharge threshold voltage, dropping below the lower limit of discharge voltage ($V_{min}$) may be prevented within a shorter time than the delay time or before the output maintenance time expires.

When the voltage of the battery B being discharged drops below the discharge threshold voltage, the control unit 140 may determine whether to calculate a target derating current value based on $t_r$ calculated by Equation 2. For example, when calculated $t_r$ by Equation 2 is smaller than $t_m$, the control unit 140 may shift the normal mode to derating mode and start the operation of calculating a target derating current value using Equation 3, and in other cases, the control unit 140 may maintain the normal mode.

If $t_r < t_m$, the control unit 140 may calculate a target derating current value by Equation 3, and determine a target derating output value $P_{derate}$ from the calculated target derating current value. The calculation equation of $P_{derate}$ is the same as Equation 10.

$$P_{derate} = V_{min} I_{derate} \qquad \text{<Equation 10>}$$

The control unit 140 may transmit, in derating mode, the output parameter including at least one of the target derating current value and the target derating output value to the control system 210 of the load device 200 through the communication interface 160.

The control system 210 derates the discharge current or output of the battery B by controlling the power conversion unit 220 using the output parameter transmitted from the control unit 140 after the delay time elapsed. That is, the control system 210 may control the power conversion unit 220 using the target derating current value or the target derating output value included in the output parameter such that the size of the discharge current outputted from the battery B is smaller than the target derating current value or the output of the battery B is smaller than the target derating output value.

Preferably, the control system 210 controls the power conversion unit 220 to gradually reduce the discharge current of the secondary battery B at a regular time interval so that the size of the discharge current may be equal to the target derating current value. Similarly, the control system 210 controls the power conversion unit 220 to gradually reduce the output of the battery B at a regular time interval so that the output of the battery B may be equal to the target derating output value.

The control unit 140 may optionally include processors, application-specific integrated circuit (ASIC), chipsets, logic circuits, registers, communication modems and data processing devices known in the art to execute the above-described various control logics. Additionally, when the control logic is implemented in software, the control unit 140 may be implemented as an assembly of program modules. In this instance, the program module may be stored in the memory, and executed by the processor. The memory may be inside or outside of the processor, and may be connected to the processor with a variety of well-known computer components. Additionally, the memory may be included in the memory unit 150 of the present disclosure. Additionally, the memory refers collectively to devices in which information is stored irrespective of the type of the device and does not refer to a particular memory device.

At least one of the various control logics of the control unit 140 may be combined, and the combined control logics may be written in computer-readable code system and recorded in computer-readable recording medium. The recording medium is not limited to a particular type when it can be accessed by a processor included in a computer. For example, the recording medium includes at least one selected from the group consisting of ROM, RAM, register, CD-ROM, magnetic tape, hard disk, floppy disk and optical data recording device. Additionally, the code system may be stored and executed in computers connected via a network in distributed manner. Further, functional programs, codes and code segments for implementing the combined control logics may be readily inferred by programmers in the technical field to which the present disclosure belongs.

Hereinafter, a method for adjusting the output parameter of the battery by the control unit 140 according to an embodiment of the present disclosure will be described in detail with reference to FIGS. 6 and 7.

Figure 6:
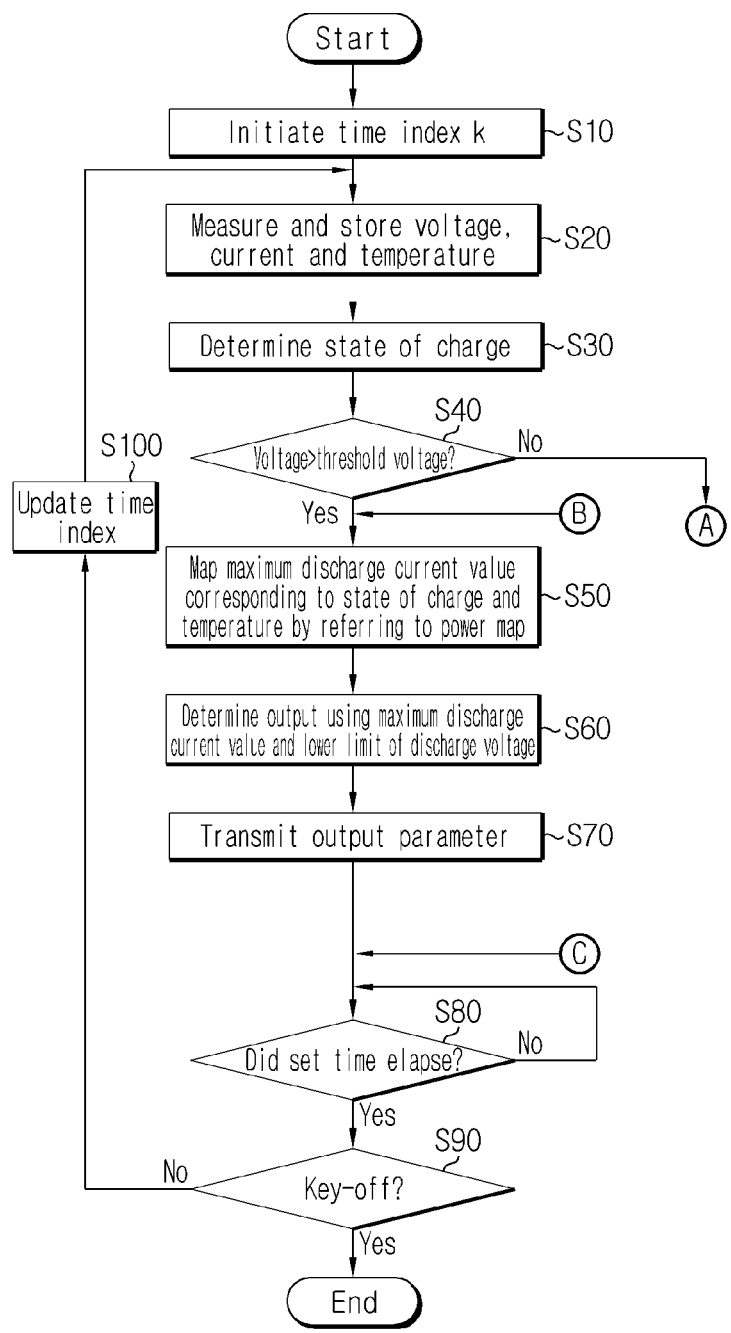
FIGS. 6 and 7 are flowcharts showing chronologically an output parameter adjustment method of a battery according to an embodiment of the present disclosure.
Figure 7:
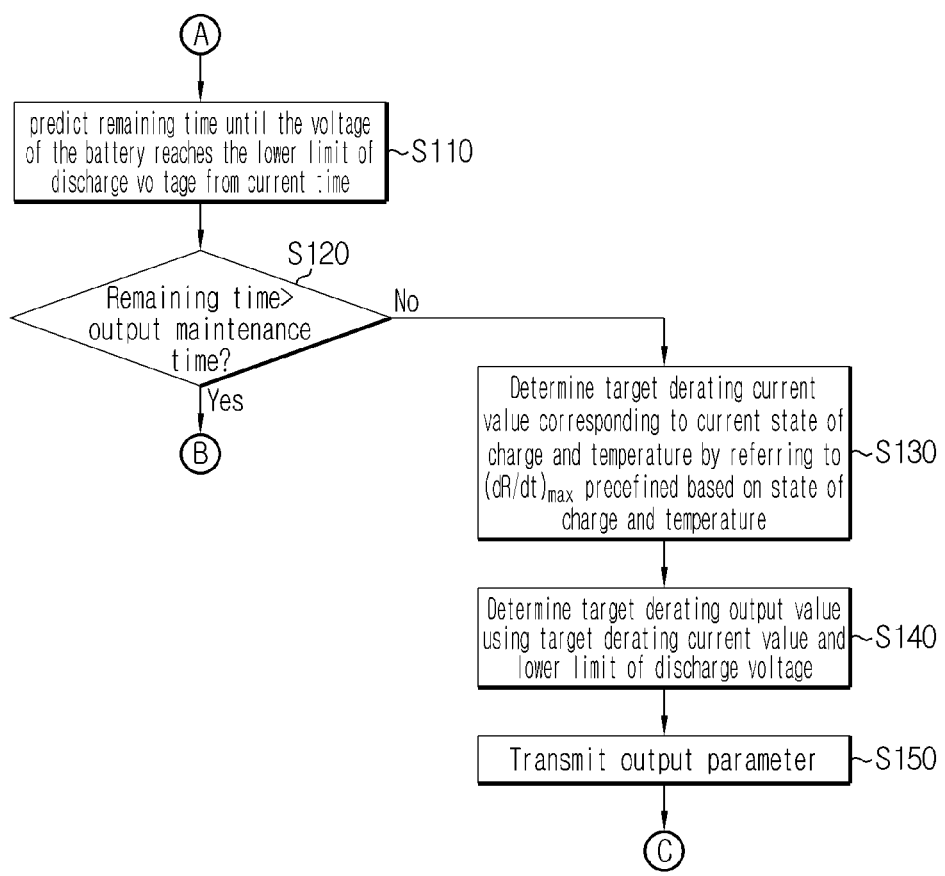

FIGS. 6 and 7 are flowcharts showing chronologically the steps of a method for predicting the remaining time until the voltage of the battery reaches the lower limit of discharge voltage according to an embodiment of the present disclosure.

First, in S10, when a process for predicting the remaining time starts, the control unit 140 initiates the time index k.

Subsequently, in S20, the control unit 140 measures the voltage, current and temperature of the battery B using the voltage measuring unit 110, the current measuring unit 120 and the temperature measuring unit 130, and stores the measured voltage value, current value and temperature value in the memory unit 150.

Subsequently, in S30, the control unit 140 determines the state of charge of the battery B selectively using voltage values, current values and temperature values stored in the memory unit 150. The state of charge may be determined using Ampere-hour counting method or the extended Kalman filter.

Subsequently, in S40, the control unit 140 determines if the voltage of the battery B is higher than the predefined discharge threshold voltage ($V_{threshold}$).

If it is determined to be YES in S40, the control unit 140 moves the process to S50 to determine the output parameter in normal mode, and transmits the determined parameter to the control system 210 of the load device 200 through the communication interface 160.

Specifically, in S50, the control unit 140 determines the maximum discharge current value ($I_{max}$) by mapping the maximum discharge current value corresponding to the current state of charge and the current temperature from a power map pre-stored in the memory unit 150.

Subsequently, in S60, the control unit 140 determines an allowed output value of the battery B by Equation 1 using the maximum discharge current value ($I_{max}$) and the predefined lower limit of discharge voltage ($V_{min}$).

Subsequently, in S70, the control unit 140 constitutes the output parameter including at least one of the maximum discharge current value and the allowed output value, and transmits the output parameter to the control system 210 of the load device 200 through the communication interface 160. Subsequently, the control system 210 controls the power conversion unit 220 by referring to the allowed output value or the maximum discharge current value included in the transmitted output parameter, to adaptively control the discharge of the battery B in the range of the allowed output value or the maximum discharge current value. That is, the control system 210 regulates the discharge output of the battery B below the allowed output value or the discharge current of the battery B below the maximum discharge current value.

Subsequently, in S80, the control unit 140 determines if a preset set time elapsed. Here, the set time corresponds to cycle in which the output parameter of the battery B is updated.

If it is determined to be YES in S80, the control unit 140 moves the process to S90, and on the contrary, if it is determined to be No in S80, the control unit 140 moves the process to S100 to update the time index k.

In S90, the control unit 140 determines if the operating condition of the battery B is a key-off condition. Here, the key-off condition refers to a case in which the battery B stopped charging or discharge. This key-off condition may be determined based on the connection condition of the switch component that controls the connection between the battery B and the load device 200.

If it is determined to be YES in S90, the control unit 140 terminates the process because there is no need to adjust the output parameter of the battery B. In contrast, if it is determined to be NO in S90, the control unit 140 moves the process to S100 to update the time index k, and reverts the process to S20 to repeat the previously-described steps again.

Meanwhile, if it is determined to be NO in S40, the control unit 140 records the current time that is equal to or later than the time the voltage of the battery B reached the discharge threshold voltage ($V_{threshold}$), and moves the process to S110.

In S110, the control unit 140 predicts the remaining time $t_r$ until the voltage of the battery reaches the lower limit of discharge voltage ($V_{min}$) from the current time. Specifically, the control unit 140 determines a discharge profile corresponding to the current state of charge and the current temperature from the discharge profile data pre-stored in the memory unit 150, and obtains $(dR/dt)_{max}$ preset for the determined discharge profile. Optionally, the control unit 140 may calculate an average value of absolute values of the current measured a predetermined number for a predetermined time in the past on the basis of the current time that is equal to or later than the arrival time, and determine a weight K corresponding to the calculated average value. The value of the weight K for each average value may be pre-stored in the memory unit 150 in the form of a look-up table. The control unit 140 may calculate the remaining time $t_r$ by allocating $V_{min}$, $V_{threshold}$, $(dR/dt)_{max}$, K and $I_0$ to Equation 2. In this instance, $I_0$ may be the current value measured through S20, and $V_{min}$ and $V_{threshold}$ are data pre-stored in the memory unit 150.

Subsequently, in S120, the control unit 140 may determine if $t_r$ predicted through S110 is equal to or more than the output maintenance time $t_m$. Along with this or separately, the control unit 140 may output a message notifying the remaining time predicted through S110.

If it is determined to be YES in S120, the control unit 140 moves the process to S50, and on the contrary, if it is determined to be No in S120, the control unit 140 moves the process to S130.

In S130, the control unit 140 determines a target derating current value ($I_{derate}$) in derating mode. That is, the control unit 140 determines the target derating current value ($I_{derate}$) using Equation 3 by referring to a $(dR/dt)_{max}$ value preset for a discharge profile corresponding to the current state of charge and the current temperature among data associated with a plurality of discharge profiles stored in the memory. The $(dR/dt)_{max}$ value to which a reference is made in S130 may be equal to the $(dR/dt)_{max}$ value obtained in S110.

Subsequently, in S140, the control unit 140 determines a target derating output value ($P_{derate}$) of the battery B using the target derating current value ($I_{derate}$) and the lower limit of discharge voltage ($V_{min}$).

Subsequently, in S150, the control unit 140 constitutes the output parameter including at least one of the target derating current value ($I_{derate}$) and the target derating output value ($P_{derate}$), and transmits the output parameter to the control system 210 of the load device 200 through the communication interface 160. Subsequently, the control system 210 controls the discharge of the battery B in the range of the target derating current value or the target derating output value by controlling the power conversion unit 220 by referring to the target derating current value or the target derating output value included in the transmitted output parameter. That is, the control system 210 regulates the discharge output of the battery B below the target derating output value or the discharge current of the battery B below the target derating current value. Preferably, the control system 210 may gradually lower the discharge current size of the battery B toward the target derating current value or gradually reduce the output of the battery B toward the target derating output value.

Subsequently, the control unit 140 goes to S80.

A series of steps shown in FIGS. 6 and 7 are periodically performed. Accordingly, the remaining time until the voltage of the battery B is higher than the discharge threshold voltage from the arrival time may be periodically updated by the control unit 140. Additionally, when the remaining time $t_r$ predicted at the point in time in which the voltage of the battery B reaches the discharge threshold voltage is less than the output maintenance time $t_m$, the output parameter reflecting the target derating current value is provided to the control system of the load device 200, so that the discharge current or the discharge output of the battery B is derated until the voltage of the battery B is higher the discharge threshold voltage or the battery B starts charging again. Of course, when the voltage of the battery B does not exceeds the discharge threshold voltage, the target derating current value and the target derating output value gradually reduce.

Meanwhile, before the voltage of the battery B exceeds the discharge threshold voltage from the arrival time, when the charger 240 starts charging the battery B again, the control unit 140 may stop predicting the remaining time and store the latest predicted remaining time in the memory.

The above-described embodiments may be applied to a situation in which the battery is discharged. Similarly, however, the present disclosure may be also applied to a situation in which the battery is charged.

When the battery is charged, the charge threshold voltage is set to be lower than the upper limit of charge voltage by a predetermined level, and determining in consideration of the delay time factor and the output maintenance time together is the same as determining the discharge threshold voltage.

Additionally, when the voltage of the battery B increases above the charge threshold voltage, the output parameter may be determined in derating mode to derate the charge current or the charge output. In this case, in Equation 3 used to determine the target derating current value, $V_{min}$ may be replaced with the upper limit of charge voltage $V_{max}$.

Further, the charge profiles rather than the discharge profiles are used to determine the level of the charge threshold voltage.

The charge profiles may be obtained by carrying out constant current charge experiments for each state of charge and each temperature of the battery B.

The size of the charge current used in each constant current charge experiment sets the maximum charge current value set by the HPPC method. The charge maximum current value may change depending on the state of charge and the temperature of the battery B.

Meanwhile, when the maximum charge current value set by the HPPC method is higher than the upper limit of charge current value that the battery B can withstand, the maximum charge current value may be replaced with the upper limit of charge current value.

Additionally, when determining the output parameter in derating mode, the output when the battery B is charged may be determined based on the current value determined to be the target derating current value.

During charging of the battery B, the determined output parameter may be provided to the control system 210 of the load device 200 through the communication interface 160.

When the output parameter is provided, the control system 210 controls the power conversion unit 220 to regulate the charge current of the battery B in the current value range included in the output parameter or the charge output of the battery B in the range of the output value included in the output parameter. Additionally, preferably, the control system 210 may perform control to gradually derate the charge current or the charge output of the battery B toward the current value or the output value included in the output parameter.

During charging of the battery B, when the voltage of the battery B does not exceed the charge threshold voltage, the maximum charge current value of the battery B may be determined using the power map, and the charge output of the battery B may be determined from the determined maximum charge current value. To this end, the power map may further include reference data associated with the maximum charge current value predefined for each state of charge and each temperature of the battery B.

Experimental Example

Hereinafter, experimental examples according to the present disclosure are described. The experimental examples described herein are provided to describe the effects of the present disclosure and the technical aspects of the present disclosure are not limited to the content disclosed by the experimental examples.

First, a lithium battery with the total capacity of 36 Ah and the state of charge of 20% was prepared. The lithium battery includes lithium metal oxide as a positive electrode material and graphite as a negative electrode material. Subsequently, the lithium battery was connected to a charge/discharge simulator that can adjust the charge/discharge power. Subsequently, the discharge profile was measured while discharging with the discharge current having the size of 360 A under 25 degrees condition.

The discharge threshold voltage on which the output of the battery B being discharged is derated based was set to 2.87V. When determining the discharge threshold voltage, the delay time factor was set to 2 seconds and the output maintenance time was set to 6 seconds.

From the time the voltage of the battery B reduced to 2.87V during discharging of the battery B with the constant current of 360 A, the discharge output of the battery B was derated according to an embodiment of the present disclosure. That is, a target derating current value was determined using Equation 3, and the discharge current size of the battery B was gradually reduced by 30 A by controlling the charge/discharge simulator gradually close to the target derating current value. In this process, voltage changes of the battery B were measured.

As the parameter values of Equation 3, $V_{min}$ was set to 2.5V, $V_{threshold}$ was set to 2.87V, $(dR/dt)_{max}$ was set to 0.4305759 mΩ, $R_0$ was set to 0.0010618 mΩ, $(t_1-t_0)$ was set to 6 seconds, and $I_0$ was set to 360 A.

Figure 8:
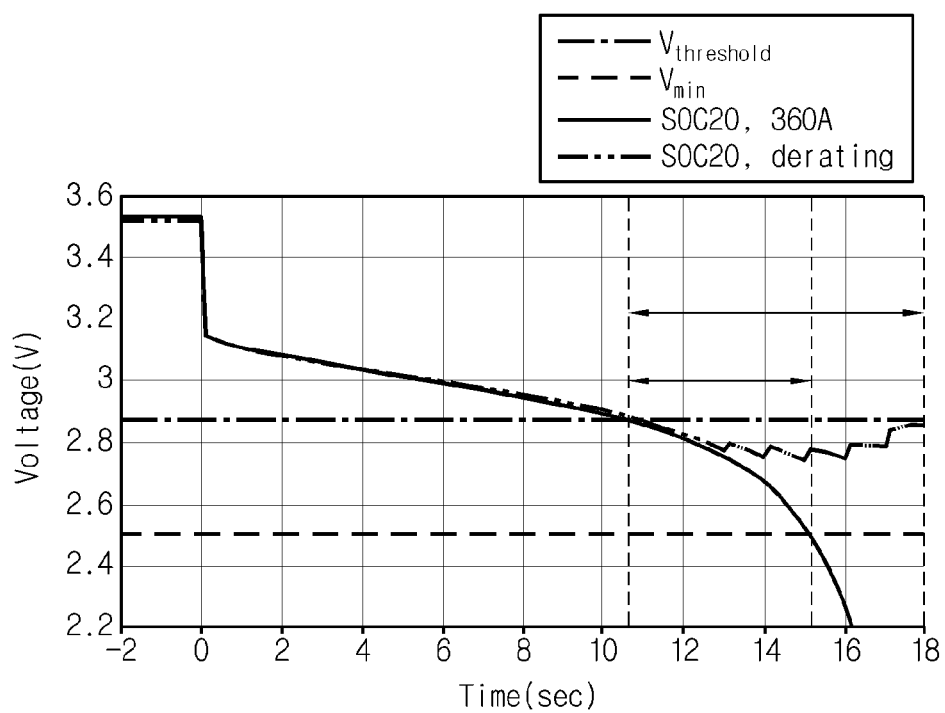
FIG. 8 is graphs showing a comparison of voltage change modeling between output derating according to an embodiment of the present disclosure and no output derating when a lithium battery with the capacity of 36 Ah and the state of charge of 20% is discharged with 360 A.

FIG. 8 shows the voltage measurement results measured in the experiment. In FIG. 8, the dotted line graph shows voltage change modeling when the output of the lithium battery is not derated. In contrast, the solid line shows voltage change modeling when the output of the lithium battery is derated from 2.87V.

In comparing the two voltage change modeling, it can be seen that when the output of the lithium battery is derated according to an embodiment of the present disclosure, the voltage of the lithium battery does not sharply reduce after reaching the discharge threshold voltage and the extent of voltage reduction is lessened.

Additionally, when the output of the lithium battery is not derated, the voltage of the lithium battery reached the lower limit of discharge voltage in 4.5 seconds. However, it can be seen that when output derating works from the time at which the voltage of the lithium battery reaches the discharge threshold voltage, the voltage level of the lithium battery is maintained higher than the lower limit of discharge voltage for a sufficient time of 6 seconds or more. These experimental results support that the present disclosure is stable and reliable output adjustment technology.

In describing various embodiments of the present disclosure, it should be understood that the components designated by '~ unit' are elements which are classified functionally rather than physically. Accordingly, each component may be selectively combined with other component, or may be divided into subcomponents efficient execution of control logic(s). However, it is obvious to those skilled in the art that even though the components are combined or divided, if the sameness of functions is acknowledged, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the invention and the equivalent scope of the appended claims.

What is claimed is:

1. A battery management apparatus, comprising:
    a voltage measuring unit configured to measure a voltage of a battery;
    a current measuring unit configured to measure a current of the battery; and
    a control unit configured to determine a state of charge based on at least one of the measured voltage or the measured current during discharging of the battery,
    wherein the control unit is configured to:
        determine if the voltage of the battery reaches a preset discharge threshold voltage,
        when the voltage of the battery is determined to have reached the discharge threshold voltage, record an arrival time at which the voltage of the battery reached the discharge threshold voltage, and determine a discharge profile based on the state of charge, wherein data defining the discharge profile is recorded through previous experimentation using a predetermined level of constant current, obtain a maximum value of resistance change ratio preset for the discharge profile, predict a remaining time until the voltage of the battery reaches a lower limit of discharge voltage from a current time that is equal to or later than the arrival time based at least in part on the following equation:

$$I_r = \frac{(V_{min} - V_{threshold})}{I_0 \left[\frac{dR}{dt}\right]_{max}}$$

wherein $t_r$ is the remaining time, $V_{threshold}$ is the discharge threshold voltage, $V_{min}$ is the lower limit of discharge voltage that is preset lower than the discharge threshold voltage, $I_0$ is the current of the battery measured at the current time, and $(dR/dt)_{max}$ is the maximum value of resistance change ratio, and output a message indicating the predicted remaining time.

2. The battery management apparatus according to claim 1, wherein the control unit is configured to:

calculate an average value of absolute values of the current of the battery measured at least a predetermined number of times for a predetermined time in the past on the basis of the arrival time, determine a weight for correcting the remaining time based on the average value and the constant current, and predict the remaining time using the following equation:

$$I_r = \frac{K(V_{min} - V_{threshold})}{I_0 \left[\frac{dR}{dt}\right]_{max}}$$

wherein K is the weight.

3. The battery management apparatus according to claim 2, wherein the control unit is configured to:

when the average value is larger than the constant current by a first reference value or more, allocate a value that is smaller than 1 and larger than 0 to the weight, when the average value is smaller than the constant current by a second reference value or more, allocate a value that is larger than 1 to the weight, and when the average value is smaller than a value obtained by adding the first reference value to the constant current and larger than a value obtained by subtracting the second reference value from the constant current, allocate 1 to the weight.

4. The battery management apparatus according to claim 1, further comprising:

a temperature measuring unit configured to measure a temperature of the battery, wherein the control unit is configured to determine the state of charge further based on the measured temperature during discharging of the battery.

5. The battery management apparatus according to claim 1, wherein the control unit is configured to:

determine if the predicted remaining time is equal to or more than an output maintenance time, and when the predicted remaining time is determined to be less than the output maintenance time, determine a target derating current value in derating mode, and the output maintenance time is requested from a load device communicably connected to the battery management apparatus.

6. The battery management apparatus according to claim 5, wherein the control unit is configured to:

determine the target derating current value using the following equation:

$$I_{derate} = \frac{V_{min} - V_{threshold} + I_0 \times R_0}{R_0 + \left[\frac{dR}{dt}\right]_{max} t_m}$$

wherein $R_0$ is a preset internal resistance of the battery, $t_m$ is the output maintenance time, and $I_{derate}$ is the target derating current value.

7. The battery management apparatus according to claim 1, wherein the control unit is configured to:

periodically update the remaining time until the voltage of the battery is higher than the discharge threshold voltage reached at the arrival time.

8. The battery management apparatus according to claim 1, wherein the control unit is configured to:

when the battery starts charging again before the voltage of the battery is higher than the discharge threshold voltage reached at the arrival time, stops predicting the remaining time, and stores a latest predicted remaining time in a memory.

9. A battery management method, comprising:

measuring a voltage and a current of a battery;

determining a state of charge based on at least one of the measured voltage or the measured current during discharging of the battery;

determining if the voltage of the battery reaches a preset discharge threshold voltage;

when the voltage of the battery is determined to have reached the discharge threshold voltage, recording an arrival time at which the voltage of the battery reached the discharge threshold voltage, and determining a discharge profile based on the state of charge, wherein data defining the discharge profile is recorded through previous experimentation using a predetermined level of constant current;

obtaining a maximum value of resistance change ratio preset for the discharge profile;

predicting a remaining time until the voltage of the battery reaches a lower limit of discharge voltage from a current time that is equal to or later than the arrival time based at least in part on the following equation:

$$I_r = \frac{(V_{min} - V_{threshold})}{I_0 \left[\frac{dR}{dt}\right]_{max}}$$

wherein $t_r$ is the remaining time, $V_{threshold}$ is the discharge threshold voltage, $V_{min}$ is the lower limit of discharge voltage that is preset lower than the discharge threshold voltage, $I_0$ is the current of the battery measured at the current time, and $(dR/dt)_{max}$ is the maximum value of resistance change ratio; and outputting a message indicating the predicted remaining time.

10. The battery management method according to claim 9, further comprising:

calculating an average value of absolute values of the current of the battery measured at least a predetermined number of times over a predetermined duration in the past on the basis of the arrival time, determining a weight for correcting the remaining time based on the average value and the constant current, and predicting the remaining time using the following equation:

$$t_r = \frac{K(V_{min} - V_{threshold})}{I_0 \left[\frac{dR}{dt}\right]_{max}}$$

wherein K is the weight.

11. The battery management method according to claim 10, further comprising:

when the average value is larger than the constant current by a first reference value or more, allocating a value that is smaller than 1 and larger than 0 to the weight, when the average value is smaller than the constant current by a second reference value or more, allocating a value that is larger than 1 to the weight, and when the average value is smaller than a value obtained by adding the first reference value to the constant current and larger than a value obtained by subtracting the second reference value from the constant current, allocating 1 to the weight.

12. The battery management method according to claim 9, further comprising:

measuring a temperature of the battery, wherein determining the state of charge is further based on the measured temperature during discharging of the battery.

13. The battery management method according to claim 9, further comprising:

requesting an output maintenance time;

determining if the predicted remaining time is equal to or more than the output maintenance time, and when the predicted remaining time is determined to be less than the output maintenance time, determining a target derating current value in derating mode.

14. The battery management method according to claim 13, further comprising:

determining the target derating current value using the following equation:

$$I_{derate} = \frac{V_{min} - V_{threshold} + I_0 \times R_0}{R_0 + \left[\frac{dR}{dt}\right]_{max} t_m}$$

wherein $R_0$ is a preset internal resistance of the battery, $t_m$ is the output maintenance time, and $I_{derate}$ is the target derating current value.

15. The battery management method according to claim 9, further comprising:

periodically updating the remaining time until the voltage of the battery is higher than the discharge threshold voltage reached at the arrival time.

16. The battery management method according to claim 9, further comprising:

when the battery starts charging again before the voltage of the battery is higher than the discharge threshold voltage reached at the arrival time, stopping predicting the remaining time, and storing a latest predicted remaining time in a memory.

17. A battery management method, comprising:

while a battery is being discharged:

determining, by a control unit, a state of charge based on at least one of a measured voltage or a measured current of the battery while the battery is being discharged; and in response to the voltage of the battery reaching a preset discharge threshold voltage:

measuring, by the control unit, the current of the battery at a point in time that the voltage of the battery reaches the preset discharge threshold voltage; and determining, by the control unit, a discharge profile of the battery while the battery is being discharged based on prerecorded discharge profile information derived through experimentation using a predetermined level of constant current;

obtaining, by the control unit, a maximum value of resistance change ratio corresponding to the determined discharge profile; and predicting, by the control unit, a duration of time from the voltage of the battery reaching a preset discharge threshold voltage until overdischarge of the battery based on each of (i) the discharge threshold voltage, (ii) a lower limit of discharge voltage at which the battery is overdischarged, wherein the lower limit of discharge voltage is less than the discharge threshold voltage, (iii) the current of the battery measured at the point in time that the voltage of the battery reaches the preset discharge threshold voltage, and (iv) the maximum value of resistance change ratio; and outputting a message indicating the calculated duration of time from the voltage of the battery reaching a preset discharge threshold voltage until overdischarge of the battery.

18. The battery management method of claim 17, wherein the preset discharge threshold voltage is preset such that the duration of time from the voltage of the battery reaching a preset discharge threshold voltage until overdischarge of the battery is larger than a delay time of the control unit and smaller than an output maintenance time of the control unit, wherein the delay time is based on an operating speed of the control unit and a speed of communication of the control unit, and wherein the output maintenance time is a duration of time during discharging of the battery for which an output of the battery is maintained.

* * * * *